(12) United States Patent  (10) Patent No.: US 9,246,486 B2
Yang et al.  (45) Date of Patent: Jan. 26, 2016

(54) ELECTRONIC DEVICE WITH NOISE-CANCELLING FORCE SENSOR

(75) Inventors: Bingrui Yang, Mountain View, CA (US); Martin P. Grunthaner, Mountain View, CA (US); Steven P. Hotelling, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 1033 days.

(21) Appl. No.: 13/329,133

(22) Filed: Dec. 16, 2011

(65) Prior Publication Data

US 2013/0154998 A1 Jun. 20, 2013

(51) Int. Cl.
| | |
|---|---|
| *H03K 17/96* | (2006.01) |
| *G06F 3/045* | (2006.01) |
| *G06F 3/044* | (2006.01) |
| *G06F 3/047* | (2006.01) |
| *G06F 3/041* | (2006.01) |

(52) U.S. Cl.
CPC ............ *H03K 17/9625* (2013.01); *G06F 3/044* (2013.01); *G06F 3/045* (2013.01); *G06F 3/047* (2013.01); *G06F 3/0414* (2013.01)

(58) Field of Classification Search
CPC ......... G06F 3/044; G06F 3/045; G06F 3/047; G06F 3/0414; H03K 17/9625
USPC ................. 345/156–184; 178/18.01–20.04
See application file for complete search history.

(56) References Cited

U.S. PATENT DOCUMENTS

| | | | | |
|---|---|---|---|---|
| 3,657,660 | A | * | 4/1972 | Pfersch ............................ 327/77 |
| 4,071,691 | A | * | 1/1978 | Pepper, Jr. ................. 178/18.05 |
| 4,777,826 | A | * | 10/1988 | Rud et al. ......................... 73/708 |
| 5,192,938 | A | * | 3/1993 | Ort ..................................... 338/5 |
| 5,280,265 | A | * | 1/1994 | Kramer et al. ................. 338/210 |
| 5,419,206 | A | * | 5/1995 | Kamioka et al. .......... 73/862.333 |
| 5,551,301 | A | * | 9/1996 | Cowan ............................. 73/708 |
| 5,801,682 | A | * | 9/1998 | Coni et al. ..................... 345/174 |
| 5,933,102 | A | | 8/1999 | Miller et al. |
| 5,965,807 | A | * | 10/1999 | Yamashita et al. .............. 73/129 |
| 6,433,524 | B1 | * | 8/2002 | Yang et al. ..................... 323/282 |
| 6,492,979 | B1 | * | 12/2002 | Kent et al. ..................... 345/173 |
| 7,085,657 | B2 | * | 8/2006 | Drossel ........................... 702/50 |
| 7,982,721 | B2 | * | 7/2011 | Hio ................................ 345/173 |

(Continued)

FOREIGN PATENT DOCUMENTS

| | | |
|---|---|---|
| CN | 1582453 | 2/2005 |
| CN | 101387929 | 3/2009 |

(Continued)

*Primary Examiner* — Dmitriy Bolotin
(74) *Attorney, Agent, or Firm* — Treyz Law Group, P.C.; G. Victor Treyz; Joseph F. Guihan

(57) ABSTRACT

An electronic device may have a housing in which components such as a display are mounted. A strain gauge may be mounted on a layer of the display such as a cover layer or may be mounted on a portion of the housing or other support structure. The layer of material on which the strain gauge is mounted may be configured to flex in response to pressure applied by a finger of a user. The strain gauge may serve as a button for the electronic device or may form part of other input circuitry. A differential amplifier and analog-to-digital converter circuit may be used to gather and process strain gauge signals. The strain gauge may be formed form variable resistor structures that make up part of a bridge circuit that is coupled to the differential amplifier. The bridge circuit may be configured to reduce the impact of capacitively coupled noise.

18 Claims, 12 Drawing Sheets

(56) References Cited

U.S. PATENT DOCUMENTS

| | | | |
|---|---|---|---|
| 8,305,358 B2* | 11/2012 | Klinghult et al. | 345/174 |
| 8,421,483 B2* | 4/2013 | Klinghult et al. | 324/686 |
| 8,514,189 B2* | 8/2013 | Wu et al. | 345/173 |
| 8,633,916 B2* | 1/2014 | Bernstein et al. | 345/174 |
| 8,659,559 B2* | 2/2014 | Wu et al. | 345/173 |
| 8,698,769 B2* | 4/2014 | Coulson et al. | 345/173 |
| 8,749,500 B2* | 6/2014 | Chen et al. | 345/173 |
| 2002/0171565 A1* | 11/2002 | Scheib | 341/34 |
| 2003/0016116 A1* | 1/2003 | Blaha | 338/2 |
| 2005/0174247 A1 | 8/2005 | Kurtz et al. | |
| 2005/0265898 A1* | 12/2005 | Bell et al. | 422/82.01 |
| 2006/0007171 A1 | 1/2006 | Burdi et al. | |
| 2006/0022959 A1* | 2/2006 | Geaghan | 345/173 |
| 2006/0087326 A1* | 4/2006 | Stevens | 324/680 |
| 2006/0138983 A1* | 6/2006 | Lee et al. | 318/254 |
| 2006/0279548 A1* | 12/2006 | Geaghan | 345/173 |
| 2006/0284856 A1* | 12/2006 | Soss | 345/173 |
| 2007/0240524 A1* | 10/2007 | Speckhart et al. | 73/862.381 |
| 2008/0136790 A1* | 6/2008 | Hio | 345/173 |
| 2009/0009483 A1* | 1/2009 | Hotelling et al. | 345/173 |
| 2009/0065267 A1* | 3/2009 | Sato | 178/18.06 |
| 2009/0189866 A1 | 7/2009 | Haffenden | |
| 2009/0282930 A1* | 11/2009 | Cheng et al. | 73/862.627 |
| 2010/0060590 A1* | 3/2010 | Wilson et al. | 345/173 |
| 2010/0123468 A1* | 5/2010 | Kim et al. | 324/648 |
| 2010/0123686 A1* | 5/2010 | Klinghult et al. | 345/178 |
| 2010/0132476 A1* | 6/2010 | Cheng et al. | 73/774 |
| 2010/0134944 A1* | 6/2010 | Yamamoto et al. | 361/143 |
| 2010/0201635 A1* | 8/2010 | Klinghult et al. | 345/173 |
| 2010/0301879 A1 | 12/2010 | Philipp | |
| 2011/0025634 A1* | 2/2011 | Krah et al. | 345/173 |
| 2011/0037713 A1* | 2/2011 | Chen et al. | 345/173 |
| 2011/0115732 A1* | 5/2011 | Coni et al. | 345/173 |
| 2011/0141052 A1* | 6/2011 | Bernstein et al. | 345/174 |
| 2011/0169758 A1 | 7/2011 | Aono | |
| 2011/0234508 A1* | 9/2011 | Oda et al. | 345/173 |
| 2012/0007832 A1* | 1/2012 | Lee et al. | 345/174 |
| 2012/0062498 A1* | 3/2012 | Weaver et al. | 345/174 |
| 2012/0062499 A1* | 3/2012 | Weaver et al. | 345/174 |
| 2012/0086668 A1* | 4/2012 | Wang et al. | 345/174 |
| 2013/0009905 A1* | 1/2013 | Castillo et al. | 345/174 |
| 2013/0018489 A1* | 1/2013 | Grunthaner et al. | 700/73 |
| 2013/0033450 A1* | 2/2013 | Coulson et al. | 345/174 |
| 2013/0069905 A1* | 3/2013 | Krah et al. | 345/174 |
| 2013/0076646 A1* | 3/2013 | Krah et al. | 345/173 |

FOREIGN PATENT DOCUMENTS

| | | |
|---|---|---|
| CN | 101932991 | 12/2010 |
| CN | 102216885 | 10/2011 |
| CN | 102239461 | 11/2011 |
| CN | 102262490 | 11/2011 |
| EP | 2037349 | 3/2009 |
| JP | 2006163618 | 6/2006 |
| KR | 2005-0082042 | 8/2005 |
| WO | 2009-054658 | 4/2009 |
| WO | 2009095302 | 8/2009 |
| WO | 2010058301 | 5/2010 |

* cited by examiner

ELECTRONIC DEVICE WITH NOISE-CANCELLING FORCE SENSOR

BACKGROUND

This relates to electronic devices and, more particularly, to electronic devices with strain gauges.

A strain gauge can be used as part of an input device to gather user input. If care is not taken, system noise such as capacitively coupled noise from a user's body may degrade strain gauge performance. Poorly performing strain gauges may give rise to erroneous strain gauge measurements.

It would therefore be desirable to be able to provide improved strain gauges for electronic devices.

SUMMARY

An electronic device may have a housing in which components such as a display are mounted. The display may be covered by a display cover layer. The display cover layer may be formed from glass, plastic, or other transparent material.

A strain gauge may be mounted on the display cover layer, on a portion of the housing, or on other support structures within the electronic device. For example, the strain gauge may be formed from patterned lines on an interior surface of the display cover layer. The strain gauge may be used to form a button or other input device for the electronic device.

The layer of material on which the strain gauge is mounted may be configured to flex in response to pressure applied by a finger of a user. The strain gauge may have a differential amplifier that produces output in response to the applied pressure.

The strain gauge may be formed from variable resistor structures that make up part of a bridge circuit that is coupled to the differential amplifier. The bridge circuit may be configured to reduce the impact of noise. For example, structures in the bridge circuit such as the variable resistor structures may have sizes (areas), shapes, and locations that are configured to equalize how much noise appears across the differential inputs of the differential amplifier. By equalizing the amount of noise between positive and negative differential inputs to the differential amplifier, noise on the output of the differential amplifier may be minimized.

Further features of the invention, its nature and various advantages will be more apparent from the accompanying drawings and the following detailed description of the preferred embodiments.

DETAILED DESCRIPTION

Figure 1:
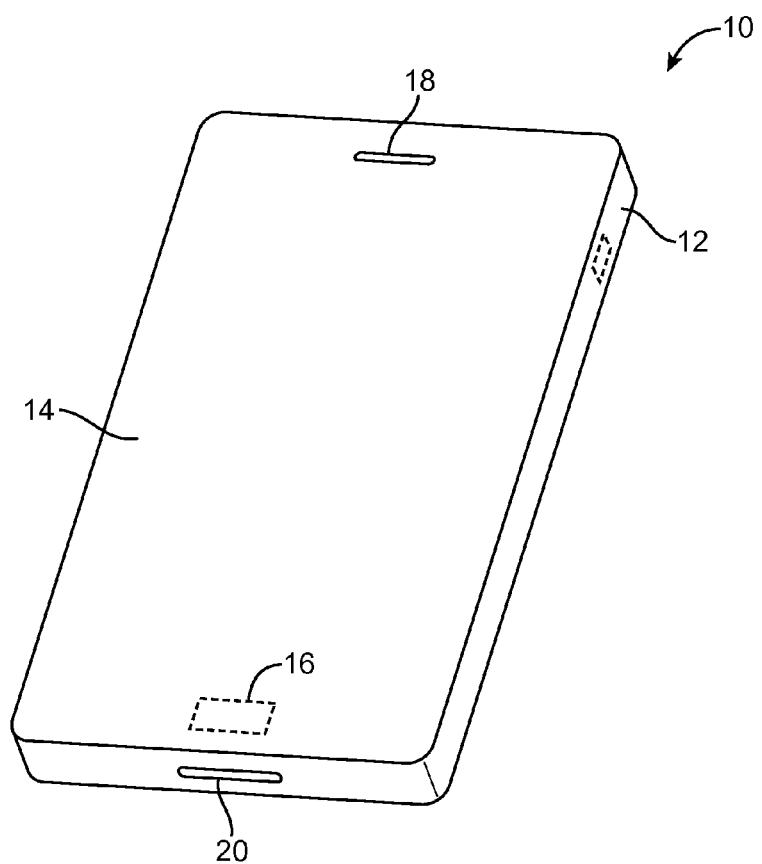
FIG. 1 is a perspective view of an illustrative electronic device with a strain gauge in accordance an embodiment of the present invention.

Electronic devices such as device 10 of FIG. 1 may be provided with one or more strain gauges. A strain gauge in a device such as device 10 may be used to gather user input. For example, a strain gauge may be used as a user input device that is sensitive to pressure from a user's finger or other external object.

Strain gauge structures may be mounted to an exposed device surface such as a portion of a display, a housing sidewall, other housing structures such as a rear housing wall structure, or other device structure. With this type of mounting location, strain gauge structures may be used to implement input devices that lie flush with an exposed surface of device 10.

Examples of input devices that may be formed using strain gauge structures include menu buttons, volume buttons, power buttons, buttons with one or more other functions, keyboard keys, sliding input-output devices (e.g., sliders for continuous volume adjustment or other control functions), and other pressure-actuated input devices. The use of a strain gauge to implement a button is sometimes described herein as an example. If desired, strain gauge structures may be used in implementing other input structures in device 10. The use of a strain gauge to form a button is merely illustrative.

Device 10 of FIG. 1 may be a portable computer, a tablet computer, a computer monitor, a handheld device, global positioning system equipment, a gaming device, a cellular telephone, a desktop computer, a computer built into a computer monitor, a television, a set-top box, or other electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials.

Housing 12 may be formed using an unibody configuration in which some or all of housing 12 is machined or molded as a single structure or may be formed using multiple structures (e.g., an internal frame structure, one or more structures that form exterior housing surfaces, etc.).

In some configurations, housing 12 may be formed using front and rear housing structures that are substantially planar. For example, the rear of device 10 may be formed from a planar housing structure such as a planar glass member, a planar plastic member, a planar metal structure, or other substantially planar structure. The edges (sidewalls) of housing 12 may be straight (vertical) or may be curved (e.g., housing 12 may be provided with sidewalls formed from rounded extensions of a rear planar housing wall).

As shown in FIG. 1, the front of device 10 may include a display such as display 14. Display 14 may, for example, be a touch screen that incorporates capacitive touch electrodes or a touch sensor formed using other types of touch technology (e.g., resistive touch, light-based touch, acoustic touch, force-sensor-based touch, etc.). Display 14 may include pixels formed from light-emitting diodes (LEDs), organic LEDs (OLEDs), plasma cells, electronic ink elements, liquid crystal display (LCD) components, or other suitable display pixel structures.

Device 10 may include input-output ports, buttons, sensors, status indicator lights, speakers, microphones, and other input-output components. As shown in FIG. 1, for example, device 10 may include one or more openings in display 14 such as an opening to accommodate speaker port 18. One or more openings in device 10 may also be formed in housing 12 (e.g., to accommodate input-output ports such as data port 20).

Strain gauge structures may be used in forming input-output components for device 10. For example, one or more buttons or other input devices may be formed from strain gauges in device 10. In the illustrative example of FIG. 1, stain gauge 16 has been used to form a button such as a menu on the lower portion of the front face of device (e.g., in a lower end portion of display 14). If desired, other locations may be used for forming buttons and other input devices from strain gauge structures. The use of strain gauge 16 to form a button on display 14 of device 10 is merely illustrative.

Force sensors in device 10 such as strain gauge 16 may be formed from variable resistors. If desired, other types of force sensors may be formed using other types of transducers. For example, force sensors in device 10 may be formed from transducers such as variable capacitors, variable inductors, or other structures that are capable of producing an output signal that is responsive to strain or force. Arrangements in which a force sensor (i.e., strain gauge 16) is formed using variable resistors are sometimes described herein as an example. This is, however, merely illustrative. Force sensors in device 10 such as strain gauge 16 may be formed from any suitable transducers if desired.

Figure 2:
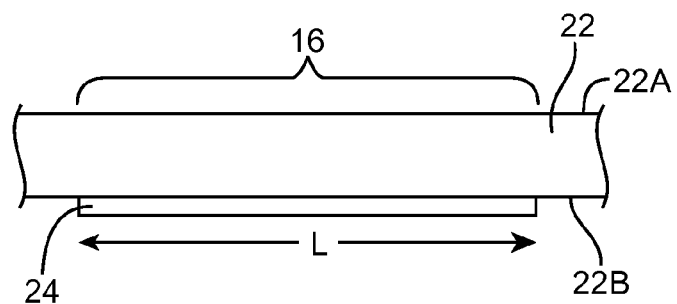
FIG. 2 is a cross-sectional side view of an electronic device structure such as a display cover layer or housing structure on which a strain gauge has been mounted in accordance with an embodiment of the present invention.

A cross-sectional side view of an illustrative strain gauge structure is shown in FIG. 2. As shown in FIG. 2, strain gauge 16 may include strain gauge structures such as strain gauge structures 24 that are mounted to a device structure such as structure 22. Strain gauge structures 24 may be, for example, variable resistor structures that are formed from a patterned material (e.g., a metal or other material that is deposited using physical vapor deposition, chemical vapor deposition, or other deposition techniques and that is patterned using photolithography or other patterning techniques).

The material from which strain gauge element 24 is formed may be patterned metal (e.g., platinum-iridium, platinum-tungsten, copper nickel alloys such as constantan, alloys of iron, nickel, and chromium, other metal alloys, or other thin-film materials such as indium tin oxide, etc.). Stain gauge 16 may be mounted on part of display 14 or part of housing 12 or may be formed from other structures in device 10. As one example, structure 22 for strain gauge 16 may be formed from a display cover layer. The display cover layer may be a layer of glass that forms the outermost layer of display 14 or a plastic layer that covers display 14. If desired, structures such as structure 22 may be formed from other planar sheets of material associated with display 14 (e.g., a color filter layer, polarizer layer, thin-film transistor layer, substrate layer, etc.).

Structure 22 may have opposing first and second surfaces such as surface 22A and surface 22B. Surface 22A may be an outer surface and surface 22B may be inner surface. For example, surface 22A may be the outer surface of a display cover layer in display 14 and surface 22B may be the inner surface of the display cover layer. Strain gauge element 24 may be located on surface 22B (e.g., an inner display surface or housing surface) in the example of FIG. 2, but may be located on surface 22A, if desired.

Figure 3:
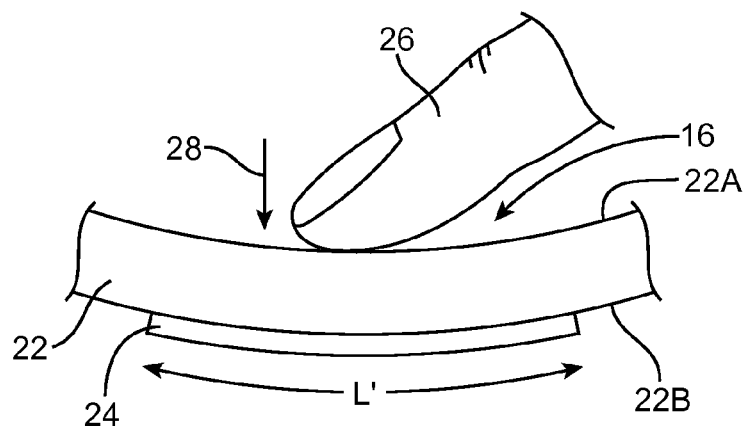
FIG. 3 is a cross-sectional side view of the strain gauge of FIG. 2 in a deflected configuration in accordance with an embodiment of the present invention.

As shown in FIG. 3, strain gauge 16 may be placed in a strained condition when a user's finger or other external object such as object 26 of FIG. 3 is pressed downwards (inwards) on surface 22A of structure 22. By exerting pressure on strain gauge 16 (i.e., by pressing on outer surface 22A of strain gauge support structure 22), structure 22 may be flexed inwardly as shown in FIG. 3. In this flexed configuration, strain gauge structures 24 may be bent.

The process of bending strain gauge structures 24 may cause strain gauge structures 24 to become stretched. For example, strain gauge structures 24 may have a lateral dimension L when resting in an unflexed (planar) configuration of the type shown in FIG. 2. Following the application of pressure to structure 22 to flex strain gauge structures 24 into the flexed configuration of FIG. 3, the magnitude of lateral dimension L may increase to L' (i.e., L'>L). This elongation in lateral dimension L (e.g., length) and associated reductions in the transverse lateral size of structures 24 (i.e., reductions in width) may increase the resistance of structures 24 when measured along their length. Strain gauge 16 may be used to measure strain produced by the pressure of external object 26 by measuring the amount that the resistance of structures 24 changes as a function of applied force from external object 26.

Figure 4:
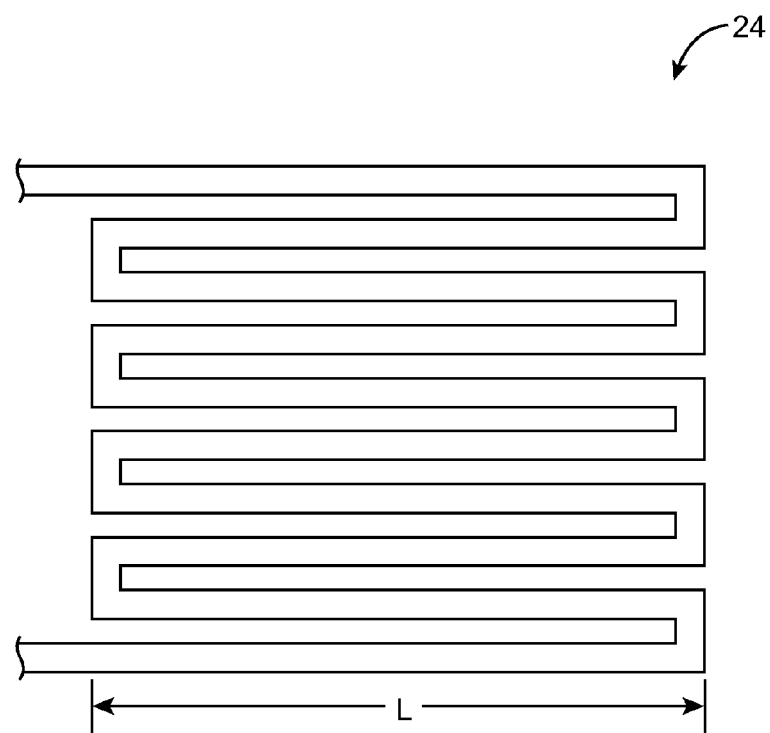
FIG. 4 is a top view of a portion of an illustrative strain gauge element such as a variable resistor in accordance with an embodiment of the present invention.

To increase the amount of measurable change in the resistance of structures 24 that is produced for a given applied pressure from external object 26 (i.e., for a given amount of flex in structure 22), one or more variable resistors in structures 24 may be provided with a meandering path, as illustrated by the portion of structures 24 that is shown in the bottom view of FIG. 4. Other shapes may be used for structures 24 if desired. Layouts such as the layout of structures 24 of FIG. 4, which increase the effective length of structures 24 while retaining a compact (e.g., rectangular) area for structures 24, are merely illustrative.

Figure 5:
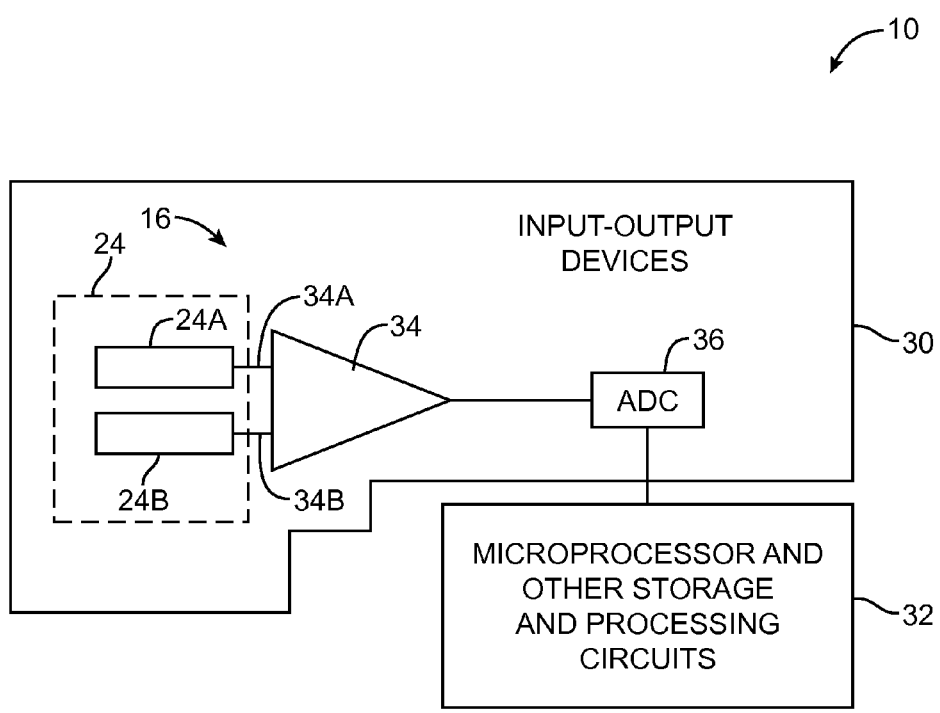
FIG. 5 is a diagram of an electronic device having a force sensor formed from a pair of force sensitive elements in accordance with an embodiment of the present invention.

FIG. 5 is a schematic diagram of illustrative circuitry of the type that may be used in electronic device 10 to gather and process stain gauge signals. As shown in FIG. 5, electronic device 10 may include control circuitry such as storage and processing circuitry 32. Storage and processing circuitry 32 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 32 may be used to control the operation of device 10. This processing circuitry may be based on one or more microprocessors, microcontrollers, digital signal processors, baseband processors, power management units, audio codec chips, application specific integrated circuits, display driver integrated circuits, etc.

Storage and processing circuitry 32 may be used to run software on device 10 such as internet browsing applications, voice-over-internet-protocol (VoIP) telephone call applications, email applications, media playback applications, operating system functions, etc. The software may be used to implement control operations such as image acquisition operations using a camera, ambient light measurements using an ambient light sensors, proximity sensor measurements using a proximity sensor, information display functions implemented using status indicators such as light-emitting-diode status indicators, touch event measurements using a touch sensor, functions associated with displaying information on multiple (e.g., layered) displays, operations associated with performing wireless communications functions, operations associated with gathering and producing audio signals, operations associated with gathering and processing button press event data, strain gauge data collection and processing functions, operations associated with responding to strain gauge information, and other functions in device 10.

Input-output circuitry 30 may be used to allow data to be supplied to device 10 and to allow data to be provided from device 10 to external devices. Input-output circuitry 30 may include sensors such as strain gauges (e.g., strain gauge 16), ambient light sensors, light-based and capacitive proximity sensors, touch sensors (e.g., light-based touch sensors and/or capacitive touch sensors that are part of a touch screen display or that are implemented using stand-alone touch sensor structures), accelerometers, and other sensors. Input-output circuitry 30 may also include one or more displays such as display 14 (FIG. 1). Display 14 may be a liquid crystal display, an organic light-emitting diode display, an electronic ink display, a plasma display, a display that uses other display technologies, or a display that uses any two or more of these display configurations. Display 14 may include an array of touch sensors (i.e., display 14 may be a touch screen). The touch sensors may be capacitive touch sensors formed from an array of transparent touch sensor electrodes such as indium tin oxide (ITO) electrodes or may be touch sensors formed using other touch technologies (e.g., acoustic touch, pressure-sensitive touch, resistive touch, optical touch, etc.). Input-output circuitry 30 may include other circuits for handling input and output. For example, input-output circuitry 30 may include communications circuitry for supporting wired and wireless communications, buttons, joysticks, click wheels, scrolling wheels, touch pads, key pads, keyboards, cameras, light-emitting diodes and other status indicators, etc.

If desired, strain gauge 16 may be used in forming a button or other user input device for electronic device 10. Strain gauge 16 may include strain gauge structures 24 such as first strain gauge structures 24A and second strain gauge structures 24B. Strain gauge structures 24A and 24B may be associated with portions (e.g., first and second respective branches) of a bridge circuit such as a Wheatstone bridge.

Control circuitry such as differential amplifier 34 and analog-to-digital converter 36 may be used in gathering and processing strain gauge signals from strain gauge structures 24. For example, differential amplifier 34 may compare strain gauge signals received from first strain gauge structures 24A (e.g., a first half of a Wheatstone bridge) to signals received from second strain gauge structures 24B (e.g., a second half of the Wheatstone bridge) and may produce a corresponding output signal that is indicative of the amount of pressure being applied to structure 22 and gauge 16.

The output signal at the output of differential amplifier 34 may be, for example, an analog voltage signal. Analog-to-digital converter circuitry 36 or other suitable processing circuitry may be used to convert the analog output signal at the output of differential amplifier 34 into digital data for subsequent processing by control circuitry 32. The control circuitry in device 10 may be configured to take any suitable actions in response to detection of strain gauge input (e.g., by responding as if a button was pressed, etc.).

Electronic noise can be coupled into strain gauge 16 through external object 26. When a user places a finger over strain gauge structures 24, capacitances arise between the user's body and strain gauge structures 24. These capacitances may allow noise such as alternating current (AC) noise to be capacitively coupled into strain gauge structures 24. The use of a differential strain gauge measurement scheme in strain gauge 16 may help reduce or eliminate such capacitively coupled noise, particularly in situations in which strain gauge structures 24 are configured so that the amount of capacitively coupled noise in the strain gauge is balanced equally between the inputs of differential amplifier 34. In particular, noise can be reduced by configuring the size, shapes, and locations of strain gauge structures such as structures 24A and 24B so as to balance the amount of capacitively coupled noise from finger 26 that appears on differential amplifier input terminals 34A and 34B.

Figure 6:
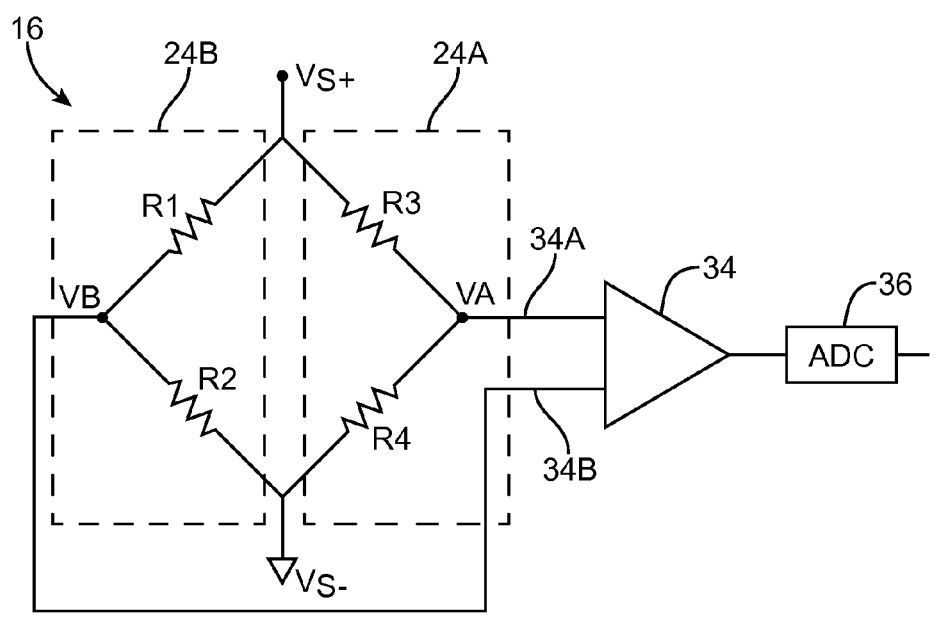
FIG. 6 is a diagram of illustrative strain gauge circuitry in accordance with an embodiment of the present invention.

Strain gauge 16 may be based on a bridge circuit such as the bridge circuit of FIG. 6 (a Wheatstone bridge). As shown in FIG. 6, strain gauge 16 may, for example, include a power supply terminal that is configured to receive a power supply voltage Vs+ (e.g., a direct current voltage). Strain gauge 16 may also include a terminal that is configured to receive a power supply voltage Vs−. Power supply voltage Vs+ may be a positive voltage, a ground voltage, or a negative voltage. Power supply voltage Vs− may be a positive voltage, a ground voltage, or a negative voltage. Power supply voltages Vs+ and Vs− are different, so that a voltage drop equal to the difference between voltage Vs+ and Vs− is applied across the Vs+ and Vs− terminals.

Resistors R1 and R2 may be coupled in series between terminals Vs+ and Vs−. Resistors R3 and R4 may likewise be coupled in series between terminals Vs+ and Vs− (i.e., in parallel with resistors R1/R2). Resistors R1 and R2 (the left-hand branch of the bridge circuit, shown as structures 24A in FIG. 5) may form a voltage divider that gives rise to a voltage VA at terminal 34A (i.e., the node interposed between resistors R1 and R2). Resistors R3 and R4 (the right-hand branch of the bridge circuit, shown as structures 24B in FIG. 5) may form a voltage divider that gives rise to a voltage VB at terminal 34B.

With one suitable configuration, the nominal resistances of R1, R2, R3, and R4 in the bridge circuit are identical, so that voltage VA and VB are the same. Other resistance values may be used for R1, R2, R3, and R4 if desired. The use of nominally equal resistances is merely illustrative.

One or more of resistances R1, R2, R3, and R4 may be implemented using variable resistor structures of the type described in connection with FIGS. 2, 3, and 4, whereas the remaining resistors may be implemented using fixed resistors (i.e., resistor structures whose resistance does not change significantly as a function of applied pressure from finger 26). By measuring changes in the difference signal (VA−VB) across the inputs of differential amplifier 34, differential amplifier 34 can produce an output signal that is proportional to the amount of pressure applied with finger 26.

Figure 7:
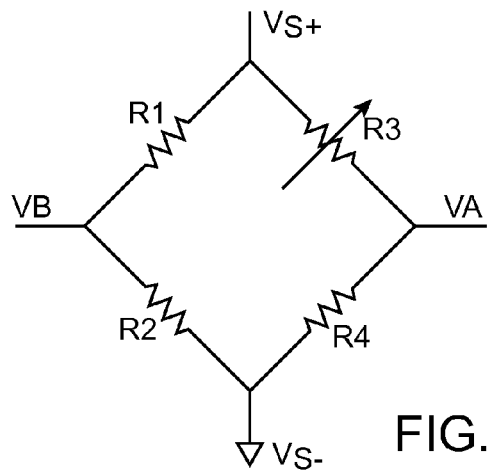
FIG. 7 is a diagram of an illustrative strain gauge circuit having a strain gauge element formed from a variable resistor in accordance with an embodiment of the present invention.
Figure 8:
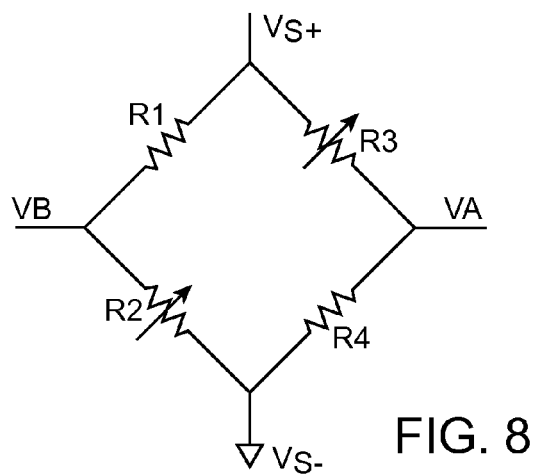
FIG. 8 is a diagram of an illustrative strain gauge circuit having a pair of strain gauge elements formed from variable resistors in accordance with an embodiment of the present invention.
Figure 9:
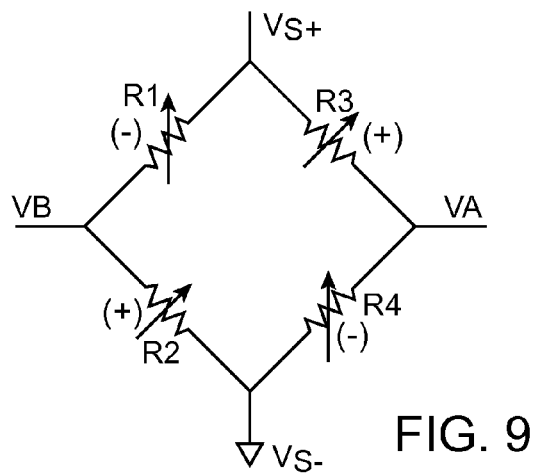
FIG. 9 is a diagram of an illustrative strain gauge circuit having four strain gauge elements in accordance with an embodiment of the present invention.

Illustrative configurations of the type that may be used for implementing differential strain gauge circuitry for strain gauge 16 are shown in FIGS. 7, 8, and 9. Other types of circuits may be used if desired. The examples of FIGS. 7, 8, and 9 are merely illustrative.

In the illustrative arrangement of FIG. 7, strain gauge 16 has been configured so that resistors R1, R2, and R4 are fixed and so that resistor R3 is variable. With this type of arrangement, resistor R3 may be implemented using a variable resistor strain gauge element such as strain gauge structures 24 of FIGS. 2, 3, and 4 (i.e., a strain gauge structure formed from a meandering patterned conductive line on the underside of structure 22 having a rectangular outline or other suitable layout). When a user presses on strain gauge 16, structure 22 will flex and the magnitude of the resistance exhibited by resistor R3 will increase, while the resistances of resistors R1, R2, and R4 will remain fixed. The resulting drop of voltage VA relative to voltage VB can be measured by differential amplifier 34 and analog-to-digital converter 36 and a corresponding digital strain gauge signal may be provided to control circuitry 32 for further processing.

In the illustrative arrangement of FIG. 8, strain gauge 16 has been configured so that resistors R1 and R4 are fixed and so that resistors R2 and R3 are variable. With this type of arrangement, resistors R2 and R3 may each be implemented using a variable resistor strain gauge element such as strain gauge structures 24 of FIGS. 2, 3, and 4 (i.e., a strain gauge structure formed from meandering patterned conductive lines on the underside of structure 22 having a rectangular outline or other suitable layout). When a user presses on strain gauge 16, structure 22 will flex. The flexing of structure 22 will cause the magnitude of the resistance exhibited by resistor R3 to change (e.g., to increase) and, because resistors R2 and R3 are preferably formed adjacent to each other on structure 22, will also cause the magnitude of resistance R2 to change (e.g., to increase). The resistances of resistors R1 and R4 will remain fixed. In this type of configuration, the pressure on the strain gauge will cause VA to drop and VB to rise. The resulting drop of voltage VA relative to voltage VB can be measured by differential amplifier 34 and analog-to-digital converter 36 for processing by control circuitry 32.

If desired, other types of configurations may be used. For example, if one of the variable resistor structures is implemented using a structure that exhibits an increase in resistance with pressure while the other variable resistor structure exhibits a decrease of resistance with pressure, the variable resistor can be located on R1 and R3 (or R2 and R4), rather than on R2 and R3 as in the illustrative example of FIG. 8.

In the illustrative arrangement of FIG. 9, strain gauge 16 has been configured so that resistors R1 and R4 exhibit decreases in resistance with increasing pressure, whereas resistors R1 and R2 exhibit increases in resistance with increasing pressure. When a user presses on a strain gauge that has been implemented using this type of configuration, structure 22 will flex and the flexing of structure 22 will cause the magnitude of VA to drop relative to the magnitude of VB. Strain can be measured by processing VA and VB using differential amplifier 34, analog-to-digital converter 36, and control circuitry 32.

Figure 10:
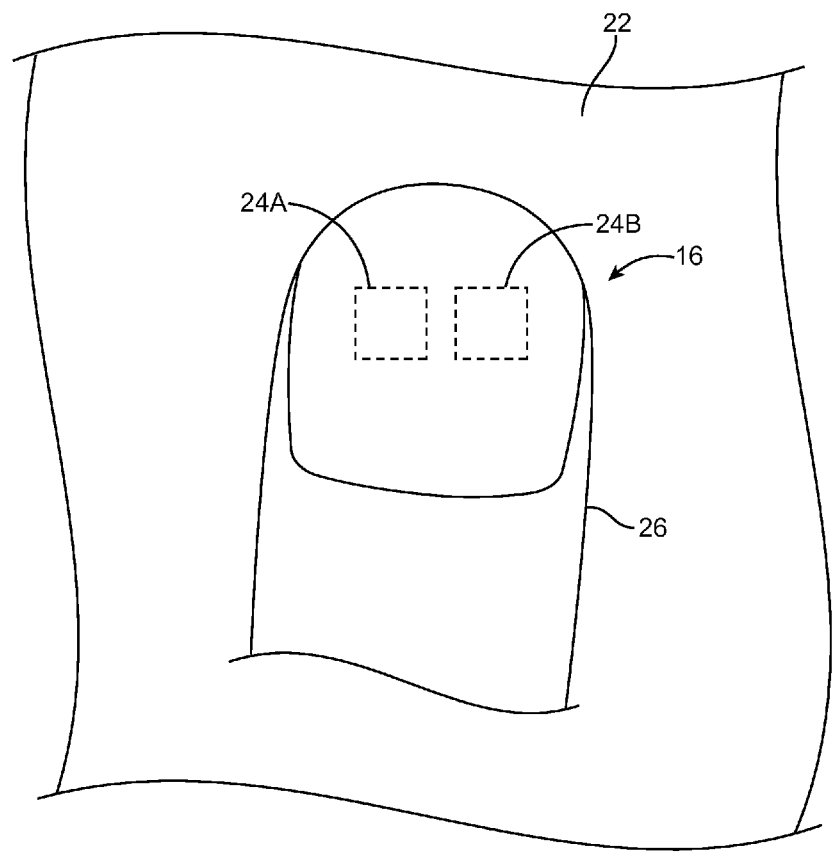
FIG. 10 is a top view of a portion of an electronic device having a strain gauge formed from differential strain gauge circuitry in accordance with an embodiment of the present invention.

To balance noise effects on inputs 34A and 34B of differential amplifier 34 and thereby improve the accuracy of strain gauge 16, it may be desirable to balance the size, shape, and location of strain gauge structures in the bridge circuitry of strain gauge 16. For example, it may be desirable to form variable resistor elements from variable resistor line shapes that are of the same size (e.g., that have the same rectangular outline size and shape), that are located adjacent to each other or that are located on top of each other in an overlapping fashion, and/or that have the same line shapes and sizes (e.g., the same linewidths and lengths). Consider, as an example, the arrangement shown in FIG. 10. As shown in FIG. 10, a user may be applying pressure from finger 26 or other external object to strain gauge 16 (e.g., to first strain gauge structures 24A and second strain gauge structures 24B). Noise at the output of differential amplifier 34 may be suppressed by ensuring that capacitive noise coupling from finger 26 to structures 24A (e.g., one or more resistors in a first branch of a bridge circuit) and 24B (e.g., one or more resistors in a second branch of the bridge circuit) is equalized (see, e.g., FIG. 6).

With one suitable arrangement (e.g., an arrangement of the type shown in FIG. 8), structures 24A and 24B may include variable resistors such as variable resistors R2 and R3, respectively. The size, shape, and location of resistors R2 and R3 may be made substantially similar to help equalize capacitive noise coupling. (Capacitive coupling to resistors R1 and R4 may likewise be equalized and/or may be minimized by forming resistors R1 and R4 from components that are not significantly affected by capacitive coupling from finger 26). With this type of arrangement, any noise such as AC noise that is produced by finger 26 on terminal 34A will also tend to be produced by finger 26 on terminal 34B. The resulting output of differential amplifier 34 (i.e., the signal on terminal 34A minus the signal on terminal 34B) will therefore be relatively unaffected by noise from finger 26.

Bridge circuits such as the circuits of FIGS. 7 and 9 may likewise be configured so that capacitive coupling to structures 24A (i.e., structures that affect the value of voltage VA) is comparable to capacitive coupling to structures 24B (i.e., structures that affect the value of voltage VB). Examples of configurations that may be used to equalize noise coupling to terminals 34A and 34B include forming first resistor structures (e.g., variable resistor structures and/or fixed resistor structures) such as those that affect the voltage on terminal 34A and second resistor structures (e.g., variable resistor structures and/or fixed resistor structures) such as those that affect the voltage on terminal 34B from meandering paths or other patterns that have the same layout area, from meandering paths or other layouts that overlap (e.g., so that variable resistor R2 and variable resistor R3 of an arrangement of the type shown in FIG. 8 substantially overlap on the underside of structure 22), from patterns in which a pair of variable resistors run parallel to each other, or from other structures that tend to be affected similarly due to noise in response to the presence of finger 26 or other external object.

If desired, structures 24A and 24B may be provided with configurations that are specifically designed to equalize the amount of noise between these structures. For example, structures 24A may include structures for forming a variable resistor, whereas structures 24B may contain exclusively or primarily conductive structures that do not change resistance as a function of applied force (as an example). The variable resistor in structures 24A may, by the nature of its shape, layout, and materials, be subject to picking up a given amount of noise when exposed to an external object during operation. To equalize noise pickup between structures 24A and 24B in this type of scenario, the conductive structures in structures 24B may be configured to have a layout, shape, and material composition that causes structures 24B to pick up the same amount of noise as structures 24A. This approach can be used to reduce noise in force sensors with one variable resistor, with two variable resistors, with more than two variable resistors, with other types of force sensing elements (e.g., variable capacitors, variable inductors, etc.).

By configuring the structures of strain gauge 16 so that noise signals at the output of the differential amplifier are suppressed, low noise strain gauge output can be provided without needing to resort to filtering schemes with long integration times that might make buttons and other structures formed from the stain gauge 16 exhibit undesirably slow response times.

Figure 11:
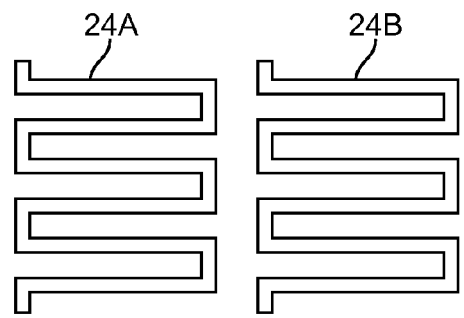
FIG. 11 is a diagram showing how noise coupling on strain gauge elements for the first and second arms of a differential strain gauge may be balanced using side-by-side meandering path elements of equal area in accordance with an embodiment of the present invention.

FIG. 11 is a diagram showing how noise coupling on strain gauge elements for the first and second arms of a differential strain gauge may be balanced using elements of equal size. In the example of FIG. 11, element 24A may be formed from a meandering path of conductive material (e.g., material used to implement a variable resistor such as resistor R2 of FIG. 8), whereas element 24B may be formed from a meandering path of conductive material with the same shape and size as element 24A (e.g., material used to implement a variable resistor such as resistor R3 of FIG. 8). Resistors R1 and R2 may be implemented using surface mount technology (SMT) parts, circuitry in an integrated circuit associated with differential amplifier 34, or other components (as examples). In this type of arrangement, most noise coupling will occur through interactions with the meandering path variable resistors of elements 24A and 24B. The use of the same layout and adjacent locations for elements 24A and 24B of FIG. 11 configures elements 24A and 24B to balance how much noise is capacitively coupled to the positive terminal of the differential amplifier from the finger of a user with how much noise is capacitively coupled to the negative terminal of the differential amplifier from the finger to reduce noise at an output of differential amplifier 34.

Figure 12:
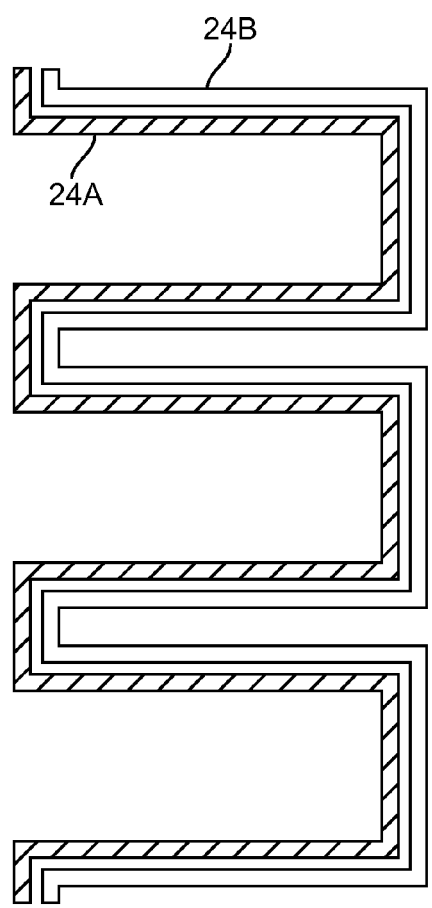
FIG. 12 is a diagram showing how noise coupling on strain gauge elements for the first and second arms of a differential strain gauge may be balanced using meandering path elements that follow the same path and run parallel to each other in accordance with an embodiment of the present invention.

Another way in which noise coupling to variable resistors in strain gauge structures 24A and 24B can be balanced to balance noise at the positive and negative differential amplifier terminals is shown in FIG. 12. In the example of FIG. 12, variable resistors in the first and second arms (e.g., resistors R2 and R3 of FIG. 8 or other suitable strain gauge structures) have been formed from meandering path elements that run parallel to each other. In this example, resistors R1 and R4 may be implemented using SMT components or other circuitry that are not substantially capacitively coupled to the user's finger. Because the path length for the structures that form the R2 and R3 variable resistors is equal and the structures are otherwise configured to have equal size and because the location of the variable resistors is nearly identical, noise coupling to the positive and negative inputs to differential amplifier 32 will be equalized.

Figure 13:
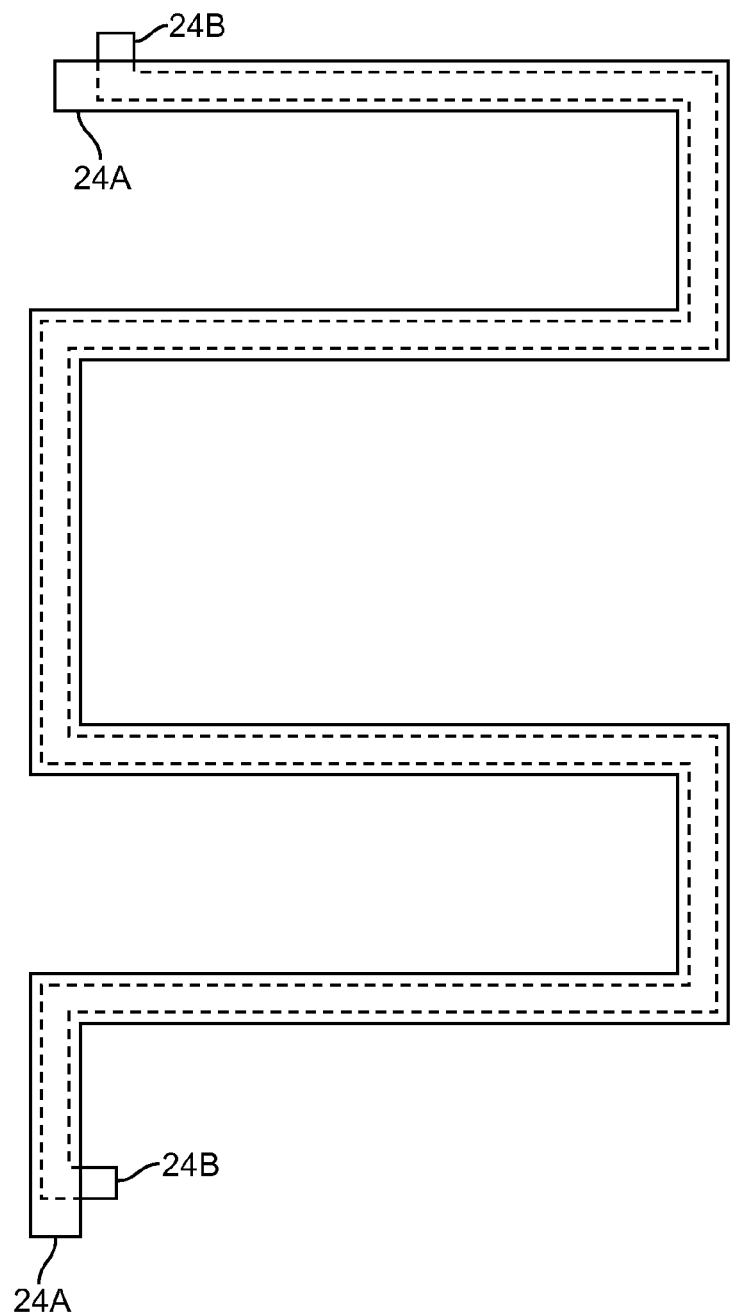
FIG. 13 is a diagram showing how noise coupling on strain gauge elements for the first and second arms of a differential strain gauge may be balanced using structures that overlap each other on a substrate in accordance with an embodiment of the present invention.

FIG. 13 is a diagram showing how strain gauge elements for the first and second arms of a differential strain gauge may be balanced using structures that overlap each other. In particular, a first variable resistor (e.g., resistor R2 of FIG. 8) may be implemented using lower structures 24B, whereas a second variable resistor (e.g., resistor R3 of FIG. 8) may be implemented using upper structures 24A. In this example, resistors R1 and R4 may be implemented using SMT components or other circuitry that are not substantially capacitively coupled to the user's finger. As shown in FIG. 13, structures 24A and 24B may overlap and may have equal size and shape to equalize noise coupling to the positive and negative inputs of differential amplifier 32.

Figure 14:
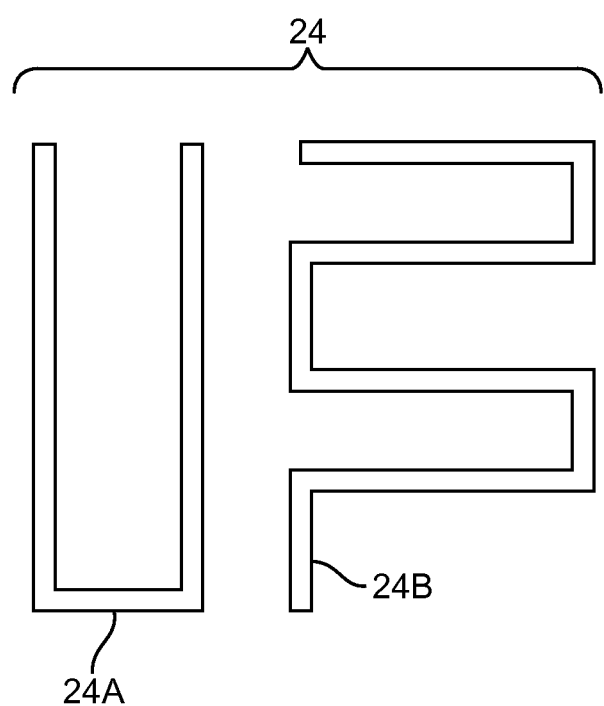
FIG. 14 is a diagram showing how noise coupling on strain gauge elements for the first and second arms of a differential strain gauge may be balanced using structures with different shapes but equal areas in accordance with an embodiment of the present invention.

The shapes of strain gauge structures 24A and 24B need not be identical. As shown in FIG. 14, for example, structures 24A (e.g., structures for implementing variable resistor R2 of FIG. 8) may have a U-shape and structures 24B (e.g., structures for implementing variable resistor R3 of FIG. 8) may have a different shape such as a meandering path shape. To equalize noise coupling to the positive and negative inputs of differential amplifier 32, the sizes of elements 24A and 24B may be equalized, even though the shapes of elements 24A and 24B are different (as an example).

If desired, additional pads of metal or other conductive material may be selectively added to structures 24A or 24B to help equalize noise coupling to the positive and negative inputs of differential amplifier 32. As an example, an additional coupling pad that does not serve as an active portion of a variable resistor may be added to structures 24A or 24B to increase noise coupling on one side of the strain gauge sufficiently to equalize noise coupling to the positive and negative inputs of differential amplifier 32. This type of arrangement is shown in FIGS. 15 and 16.

Figure 15:
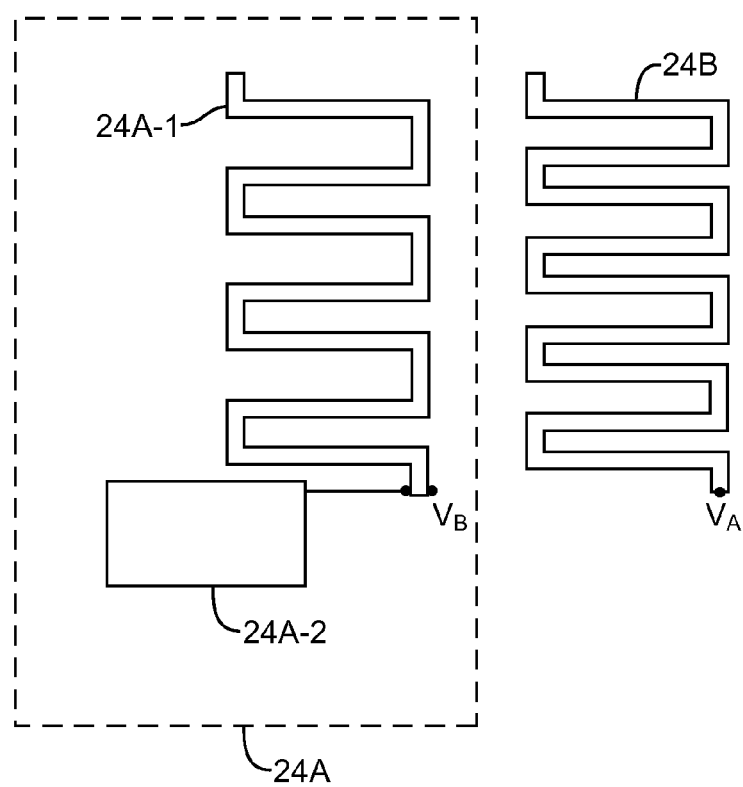
FIGS. 15 and 16 are diagrams showing how noise coupling on strain gauge elements for the first and second arms of a differential strain gauge may be balanced using coupling pad structures in accordance with an embodiment of the present invention.
Figure 16:
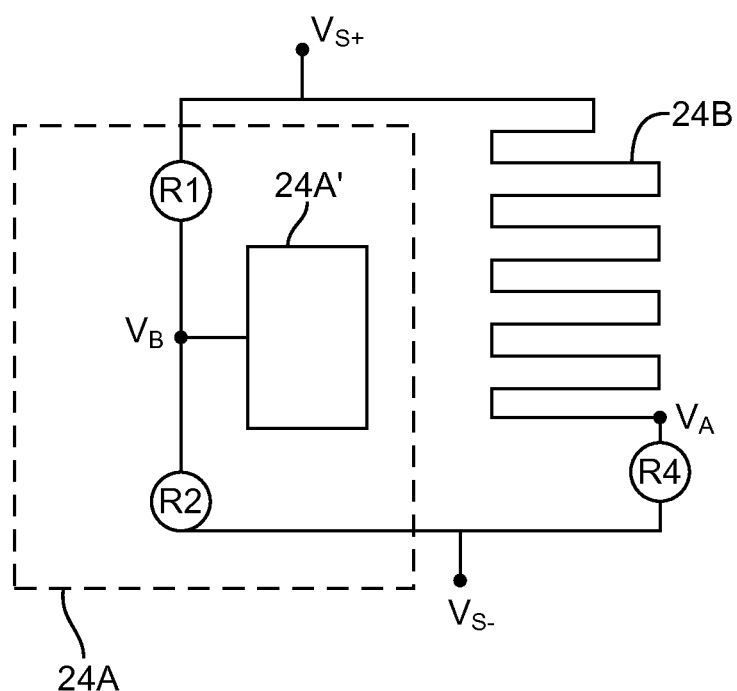

In the example of FIG. 15, structure 24A-1 may be a meandering path variable resistor (e.g., resistor R2 of FIG. 8) and structure 24B may be a meandering path variable resistor (e.g., resistor R3 of FIG. 8). Resistors R1 and R4 may be formed from SMT parts (or other circuitry that does not couple significantly to the user's finger compared to resistors R2 and R3) or may be formed from structures that couple equally to the user's finger. Coupling pad 24A-2 may be added to structures 24A to help balance the area consumed by structures 24A and 24B and thereby equalize noise coupling to the positive and negative inputs of differential amplifier 32. In the FIG. 16 example, which may correspond to a strain gauge such as strain gauge 16 of FIG. 7, variable resistor R3 has been implemented using meandering path structure 24B. Resistors R1, R2, and R4 may be implemented as SMT parts (as an example). Coupling pad 24A' has been added to structures 24 (i.e., to node VB) to help balance the area consumed by structures 24A and 24B and thereby equalize noise coupling to the positive and negative inputs of differential amplifier 32.

In general, any suitable strain gauge design (e.g., any of the designs of FIGS. 7, 8, and 9 or other designs) may be provided with structures that balance noise coupling to the positive and negative inputs of differential amplifier 32 to reduce noise at the output of the differential amplifier. The examples of FIGS. 11, 12, 13, 14, 15, and 16 are merely illustrative.

The foregoing is merely illustrative of the principles of this invention and various modifications can be made by those skilled in the art without departing from the scope and spirit of the invention.

What is claimed is:

1. An electronic device, comprising:
a strain gauge having at least one variable resistor;
a differential amplifier that receives signals from the at least one variable resistor, wherein the electronic device comprises a layer of material, wherein the at least one variable resistor comprises first and second variable resistors in a bridge circuit, and wherein the first and second variable resistors are adjacent to each other on the layer of material; and
a display, wherein the at least one variable resistor comprises structures on the display.

2. The electronic device defined in claim 1 wherein the layer of material is a display cover layer of the display, and wherein the first and second variable resistors comprise patterned material on the display cover layer.

3. The electronic device defined in claim 2 wherein the display cover layer comprises a layer of cover glass having an exterior surface and an interior surface and wherein the patterned material comprises a meandering line on the interior surface.

4. The electronic device defined in claim 1 wherein the layer of material is configured to flex in response to pressure from a finger of a user, and wherein the at least one variable resistor comprises variable resistor structures formed on an interior surface of the layer of material.

5. The electronic device defined in claim 4 wherein the layer of material comprises glass.

6. The electronic device defined in claim 4 further comprising housing structures that include the layer of material.

7. The electronic device defined in claim 4 wherein the bridge circuit has a first node coupled to a first differential input of the differential amplifier and a second node coupled to a second differential input of the differential amplifier, wherein the variable resistor structures are coupled to the first and second differential inputs, and wherein the variable resistor structures are configured to balance how much noise is capacitively coupled to the first differential input from the finger with how much noise is capacitively coupled to the second differential input from the finger to reduce noise at an output of the differential amplifier.

8. The electronic device defined in claim 4 wherein the first and second variable resistors have the same shape and same area on the layer of material to balance how much noise is capacitively coupled to a first differential input of the differential amplifier from the finger with how much noise is capacitively coupled to a second differential input of the differential amplifier from the finger to reduce noise at an output of the differential amplifier.

9. The electronic device defined in claim 4 wherein the first and second variable resistors have meandering paths on the layer of material that run parallel to each other to balance how much noise is capacitively coupled to a first differential input of the differential amplifier from the finger with how much noise is capacitively coupled to a second differential input of the differential amplifier from the finger to reduce noise at an output of the differential amplifier.

10. The electronic device defined in claim 4 wherein the first and second variable resistors have different shapes and wherein the first and second variable resistors have equal size on the layer of material to balance how much noise is capacitively coupled to a first differential input of the differential amplifier from the finger with how much noise is capacitively coupled to a second differential input of the differential amplifier from the finger to reduce noise at an output of the differential amplifier.

11. The electronic device defined in claim 4 wherein the first and second variable resistors have different shapes and different sizes on the layer of material, the electronic device further comprising a coupling pad in the strain gauge that is coupled to the first variable resistor to balance how much noise is capacitively coupled to a first differential input of the differential amplifier from the finger with how much noise is capacitively coupled to a second differential input of the differential amplifier from the finger to reduce noise at an output of the differential amplifier.

12. The electronic device defined in claim 4 wherein the variable resistor structures are configured to balance how much noise is capacitively coupled from the finger of the user to a first differential input of the differential amplifier through the variable resistor structures with how much noise is capacitively coupled from the finger of the user to a second differential input of the differential amplifier through the variable resistor structures to reduce noise at an output of the differential amplifier.

13. The electronic device defined in claim 12 wherein the layer of material comprises a display cover layer having first and second opposing surfaces and wherein the variable resistor structures are formed on the second surface.

14. The electronic device defined in claim 13 wherein the display cover layer comprises a layer of cover glass and wherein the first surface comprises an external surface of the cover glass that is configured to flex inwardly in response to pressure from the finger.

15. The electronic device defined in claim 14 further comprising an analog-to-digital converter configured to digitize analog output signals received from the output of the differential amplifier.

16. The electronic device defined in claim 15 wherein the cover glass has first and second ends and wherein the variable resistor structures are located at the second end and are configured to serve as a button for the electronic device.

17. An electronic device, comprising:
a strain gauge having at least one variable resistor; and
a differential amplifier that receives signals from the at least one variable resistor, wherein the electronic device comprises a layer of material, wherein the at least one variable resistor comprises first and second variable resistors in a bridge circuit, wherein the first and second variable resistors are adjacent to each other on the layer of material, wherein the layer of material is configured to flex in response to pressure from a finger of a user, wherein the at least one variable resistor comprises variable resistor structures formed on an interior surface of the layer of material, and wherein the first and second variable resistors balance how much noise is capacitively coupled to a first differential input of the differential amplifier from the finger with how much noise is capacitively coupled to a second differential input of the differential amplifier from the finger to reduce noise at an output of the differential amplifier.

18. An electronic device, comprising:
a strain gauge having at least one variable resistor; and
a differential amplifier that receives signals from the at least one variable resistor, wherein the differential amplifier has first and second differential inputs, the electronic device further comprising a coupling pad in the strain gauge to balance how much noise is capacitively coupled to the first differential input with how much noise is capacitively coupled to the second differential input to reduce noise at an output of the differential amplifier.

* * * * *